(12) United States Patent
Kuang et al.

(10) Patent No.: US 6,281,737 B1
(45) Date of Patent: Aug. 28, 2001

(54) METHOD AND APPARATUS FOR REDUCING PARASITIC BIPOLAR CURRENT IN A SILICON-ON-INSULATOR TRANSISTOR

(75) Inventors: Jente Benedict Kuang, Poughkeepsie; Pong-Fei Lu, Yorktown Heights; Mary Joseph Saccamango, Poughquag, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/196,907

(22) Filed: Nov. 20, 1998

(51) Int. Cl.[7] .......................... H03K 17/16; H03K 17/30
(52) U.S. Cl. ............................. 327/382; 327/534
(58) Field of Search .................... 327/382, 534, 327/535

(56) References Cited

U.S. PATENT DOCUMENTS

| | | | |
|---|---|---|---|
| 5,405,795 | 4/1995 | Beyer et al. | 437/41 |
| 5,729,039 | 3/1998 | Beyer et al. | 257/347 |
| 5,774,411 | 6/1998 | Hsieh et al. | 365/230.06 |
| 5,880,620 | * 3/1999 | Gitlin et al. | 327/534 |
| 6,020,778 | * 2/2000 | Shigehara et al. | 327/534 |

OTHER PUBLICATIONS

C. Chuang et al, SOI for Digital CMOS VLSI: Design Considerations and Advances, Proceedings of the IEEE, vol. 86, No. 4, Apr. 1998, pp. 689–721.

Pong–Fei Lu et al, Floating–Body Effects in Partially Depleted SOI CMOS Circuits, IEEE Journal of Solid–State Circuits, vol. 32., No. 8, Aug. 1997, pp. 1241–1253.

Jente B. Kuang et al, SRAM Bitline Circuits on PD SOI: Advantages and Concerns, IEEE Journal of Solid–State Circuits, vol. 32, No. 6, Jun. 1997, pp. 837–843.

\* cited by examiner

*Primary Examiner*—Terry D. Cunningham
*Assistant Examiner*—Quan Tra
(74) *Attorney, Agent, or Firm*—Anthony V. S. England; Mark E. McBurney (57) ABSTRACT

In a method and apparatus for reducing parasitic bipolar current in an insulated body, field effect transistor ("FET"), for an n-type FET, the body of the insulated body NFET is electrically isolated, responsive to turning on the NFET. This permits a charge to accumulate on the body in connection with turning the NFET on, temporarily lowering the threshold voltage for the insulated body NFET. Responsive to turning off the insulated body NFET, at least a portion of the charge on the body is discharged. This discharging of the body reduces parasitic bipolar current which would otherwise occur upon turning the NFET back on if the body had charged up during the time when the NFET was off. For a p-type FET that is susceptible to parasitic bipolar current, the body is discharged responsive to turning off the PFET, and isolated responsive to turning on the PFET.

20 Claims, 6 Drawing Sheets

FIG. 1

PRIOR ART

METHOD AND APPARATUS FOR REDUCING PARASITIC BIPOLAR CURRENT IN A SILICON-ON-INSULATOR TRANSISTOR

FIELD OF THE INVENTION

The present invention relates to silicon-on-insulator field effect transistors, and more particularly to reduction of parasitic bipolar current in such FET's.

BACKGROUND OF INVENTION

Silicon-on-insulator ("SOI") field effect transistors ("FET's"), particularly wide SOI FET's in pass gate applications, suffer a parasitic bipolar currents the effects of which are most severe when the circuit is initially turned on after being idle for a long period of time, i.e. a time in the range of milliseconds. This is because the floating body of the SOI FET can develop a body charge over time. The amount of such body charge will depend on the potentials at the source, drain, and gate terminal electrodes of the SOI FET. The maximum amount of charging occurs when the gate is completely turned off and both the source and drain electrode are biased at the highest potential vdd. During the subsequent switching of the source or drain electrode of the SOI FET, the accumulated body charge will be discharged by means of a transient bipolar current. This parasitic current degrades performance, including noise and timing performance. See, for example, C. Chuang, P.Lu, and C. Anderson, *SOI for Digital CMOS VLSI: Design Considerations and Advances*, Proceedinigs of the IEEE, v. 86, No. 4, April 1998, p. 689–720, which is hereby incorporated by reference (discussing the nature of and occasion for the parasitic current in connection with the description therein of FIGS. 1 and 2), and C. I-Isieh et al., *Methods to Enhance SOI SRAM Cell Stability*, U.S. Pat. No. 5,774,411, which is hereby incorporated by reference (discussing, in the Background of the Invention section, the parasitic, lateral, bipolar transistor formed by the source, drain and channel, i.e., floating body, region of an FET). Pass gates are particularly susceptible to parasitic bipolar current because it is not uncommon in pass gate applications for both the source and drain of a pass gate to be driven to a relatively high voltage level, and because it is not uncommon for pass gates to be relatively wide.

A number of circuit structures are known for mitigating this problem in a variety of contexts. For example, for a number of applications, including pass gates, it is known to connect the SOI NFET body to the NFET gate. Id. at p. 706. This has the beneficial effect of minimizing Vt loss (aka "dynamic Vt control"), improving drive, and suppressing leakage, but is disadvantageous from the standpoint of area increase and incompatibility with bulk design.

It is also known to actively bias the body of SOI NFET and PFET devices in an inverting output stage of a driver. Id. at 709 (showing a network of FET's responsive to the input to and output from the SOI output stage). Such an arrangement also has the beneficial effect of minimizing Vt loss, improving drive. and suppressing leakage, but has disadvantages of more expensive fabrication process, significantly larger area for the extra diode and capacitor, and increasing input capacitance (which slows down the circuit). It is also known to discharge the body of a SOI FET responsive to a signal timed to occur shortly before the gate of the FET is selected (hereinafter, a "pre-discharge signal"), or responsive to the accumulated charge on the body. This discharging has the possible benefit of reducing parasitic bipolar current during functional, initial cycle switching, provided that the discharging is early enough or that the discharge device is large enough with respect to the charge on the body to sufficiently discharge the body during the discharging interval before the gate is selected. In addition to these limitations, it also disadvantageously requires that a timing signal be generated for the pre-discharge signal.

Therefore, although there are known circuits and techniques for mitigating parasitic, bipolar current in an insulated body FET, because of the disadvantages described above, and others, a need remains for improved methods and structures for mitigating such parasitic, bipolar current.

SUMMARY OF THE INVENTION

In a first form, an apparatus for reducing parasitic bipolar current in a field effect transistor ("FET") includes an insulated body NFET, having a body disposed, at least in part, below a gate electrode of the insulated body NFET. Body-charge control circuitry is coupled to the gate of the NFET and to the body. The body-charge control circuitry includes a body-charge control FET, with first and second conducting electrodes and a gate electrode, has its first conducting electrode electrically coupled to the body of the insulated body NFET and its second conducting electrode electrically coupled to an electrical sink. The body-charge control circuitry also includes an inverter, having its input electrically coupled to the insulated body NFET gate, and its output electrically coupled to the body-charge control NFFT gate, so that when a voltage applied to the insulated body NFET gate is above a certain first voltage level, the inverter output voltage tends to turn off the body-charge control FET and electrically isolate the body from the sink, thereby permitting a charge to accumulate on the body. Conversely, when the voltage applied to the insulated body NFET gate electrode is below a certain second voltage level, the inverter output voltage tends to turn on the body-charge control FET and electrically couple the body to the sink, thereby discharging at least a portion of any charge accumulated on the body.

In an additional aspect, the apparatus includes a SOI PFET. If the SOI PFET is susceptible to parasitic bipolar current the apparatus includes a second body-charge control circuitry, for the PFET. The second body-charge control circuitry isolates the PFET body when the PFET is on, and discharges the body when the PFET is off. (Note that in the case of an insulated body PFET, the term "discharge" is herein used differently than in the case of an insulated body NFET. For the PFET, negative charge may accumulate on the insulated body when the body is isolated; whereas for the NFET positive charge may accumulate when the NFET body is isolated. Therefore, for the PFET, negative charge is discharged. But for the NFET, positive charge is discharged.)

In another form, a method includes steps for reducing parasitic bipolar current in a NFET having an insulated body, the body being disposed, at least in part, below a gate electrode of the NFET. In one step, the body of the insulated body NFET is electrically isolated, responsive to a voltage applied to the insulated body NFET gate electrode being above a certain first voltage level. This permits a charge to accumulate on the body, lowering the threshold voltage for the insulated body NFET.

In another step, at least a portion of the charge on the body of the insulated body NFET is electrically discharged, responsive to the voltage applied to the insulated body NFET gate electrode being below a certain second voltage level. This discharging reduces parasitic bipolar current which would otherwise occur upon turning the NFET back on if the body had charged up during the time when the NFET was off.

In another aspect, the discharging includes electrically coupling the insulated NFET body to a sink having a voltage lower than a voltage level of the accumulated charge. Furthermore, the SOI FET body is thus coupled to the sink whenever the SOI FET gate electrode voltage is below the certain second voltage level.

In another form, a method includes steps for reducing parasitic bipolar current in a PFET having an insulated body, the body being disposed, at least in part, below a gate electrode of the PFET. The body of the insulated body PFET is discharged, responsive to a voltage applied to the insulated body PFET gate electrode being above a certain first voltage level. Also, the body of the insulated body PFET is electrically isolated, responsive to the voltage applied to the insulated body PFET gate electrode being below a certain second voltage level. The discharging of the PFET body while the PFET is off reduces parasitic bipolar current which could otherwise occur upon turning the PFET back on if certain conditions occurred during the time when the PFET was off.

While the invention has been shown and described with reference to particular embodiments thereof, it will be understood by those skilled in the art that the foregoing and other changes in form and detail may be made therein without departing from the spirit and scope of the invention.

BRIEF DESCRIPTION OF THE DRAWINGS

FIG's 3 through 5 are voltage responses for a number of different circuit configurations.

DETAILED DESCRIPTION

Figure 1:
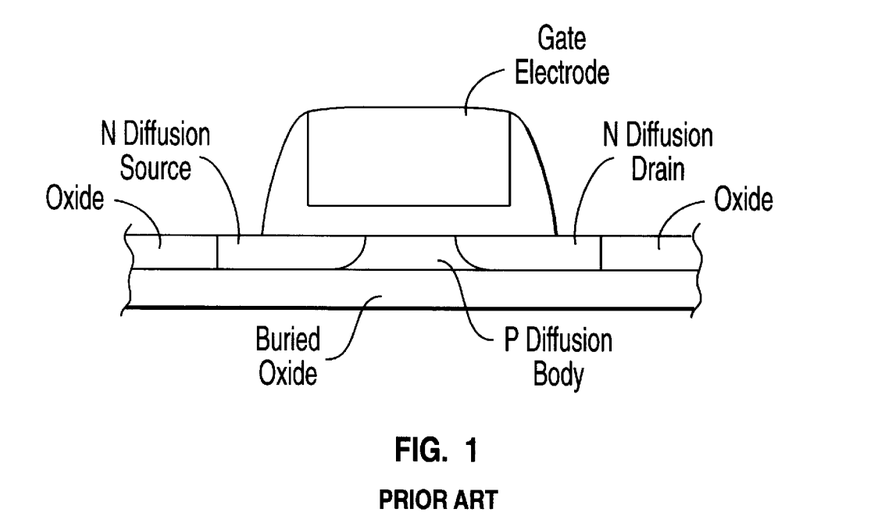
FIG. 1 is a cross section of an SOI NFET.

Referring to FIG. 1, a cross section of an SOI CMOS NFET is shown. The SOI NFET has a body contact (not shown in FIG. 1). Numerous methods and structures are known for forming such a body contact for CMOS FET's. See, for example, Beyer, et al., *Method of Forming a SOI Transistor Having a Self-Aligned Body Contact*, U.S. Pat. No. 5,405,795; and Beyer, et al., *SOI Transistor Having a Self-Alioned Body Contact*, U.S. Pat. No. 5,729,039, which are hereby incorporated by reference.

Figure 2:
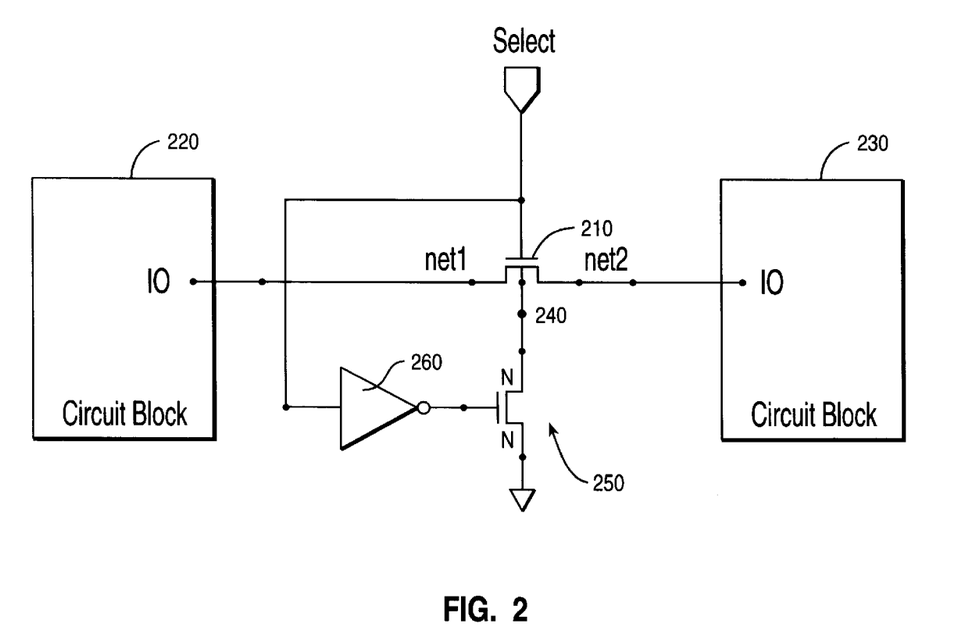
FIG. 2 is a schematic of an embodiment of the present invention, having a single, controlled NFET, and circuitry for controlling discharge of the NFET body.

Referring now to FIG. 2, SOI NFET 210 has its source electrode connected to circuit element 220 at node "net1" and its drain connected to circuit element 230 at node "net2". Circuit elements 220 and 230 represent other circuitry, such as other FET's. resistors, termination's, etc. For example, the FET 210 could be a pass gate, or it could be a logic device in one leg of a NOR circuit, or in one branch of a multiplexer circuit. The FET 210 could be for shorting a pin in circuitry 220 to a pin in circuitry 230, when it is active.

The CMOS NFET 210 body is connected at node 240 to the drain electrode of CMOS NFET 250. The NFET 250 has its source grounded. Its gate is connected to CMOS inverter 260 output. The input to inverter 260 is connected to the gate of NFET 210, which is also connected to a "select" line, on which a voltage is impressed to control the gate 210. When the "Select" voltage, applied to the gate of NFET 210 and the input of inverter 260, goes high, this tends to drive the inverter 260 output low. The inverter output going low tends to turn off NFET 250. With body-charge control NFET 250 thus tending to be off, this tends to isolate the body of NFET 210, allowing it to accumulate charge and thereby lowering the FET 210 threshold voltage.

When the voltage impressed on the select line goes low, the NFET 210 is deselected, and the output of inverter 260 goes high, tending to turn on NFET 250. With body-charge control NFET 250 tending to be on this tends to ground the body of SOI NFET 210. This body-charge control of the NFET 210 body prevents a buildup of charge on the body which could otherwise occur if the voltage were high on the source and drain of NFET 210. The lack of charge buildup tends to prevent initial cycle parasitic current that would otherwise occur upon applying a high signal to the select line of the NFET 210 if a charge had built up on the body.

Thus, the embodiment described provides the beneficial effect of lowering threshold voltage in a floating body SOI FET during activation, and transition to activation of NFET 210, while also achieving the benefit of no charge buildup in a grounded body FET during deactivation, and transition between deactivation and activation. Furthermore, these benefits are achieved with a relatively small number of elements, e.g., inverter 260 and NFET 250. Still further, the benefits are achieved with the inverter 260 and NFET 250 being responsive solely to voltage applied to the NFET 210 gate, that is, without circuitry for generating a pre-discharge signal timed to occur in advance of activating the NFET 210 gate.

In a still further advantage, since the body of FET 210 is discharged throughout substantially the entire interval when the gate of FET 210 is deselected, the discharging is not limited to occurring solely during a relatively shorter pre-discharge interval timed immediately before the gate is selected. Thus, the invention is advantageous in that it is relatively insensitive to the fabrication quality of the body contact. Similarly, the discharge (aka body-charge control) FET 250 may be relatively smaller than would be required for a short discharge interval. For example, it has been empirically determined that the FET's of the inverter 260 and the body-charge control FET 250 may each be ¹⁄₁₀ the size of the insulated body FET 210.

Figure 2A:
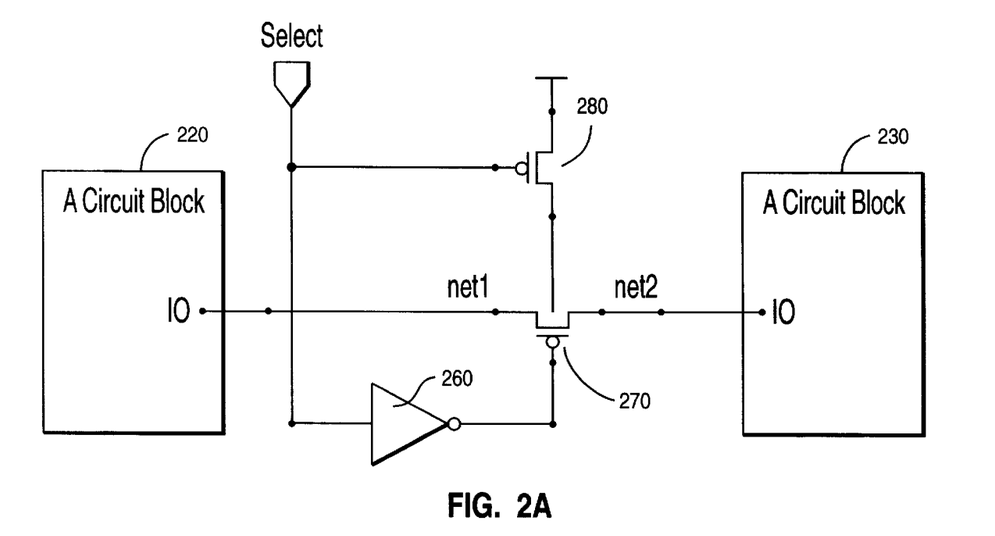
FIG. 2a is a schematic of an embodiment of the present invention, having a single controlled PFET, and circuitry for controlling discharge of the PFET body.

Referring now to FIG. 2A, another embodiment is shown for an insulated body FET 270, where the FET is a p-type FET. Control circuitry is coupled to the body and the gate of the insulated body PFET, for controlling charge on the body responsive to a voltage applied to the gate electrode. The control circuitry includes a body-charge control PFET 280. The PFET 280 first conducting electrode is electrically coupled to the body of the insulated body PFET 270. The body-charge control PFET 280 second conducting electrode is electrically coupled to an electrical source.

The control circuitry also includes an inverter 260. The inverter input is electrically coupled to the body-charge control PFET 280 gate electrode. The inverter output is electrically coupled to the insulated body PFET 270 gate electrode, so that when the voltage applied to the charge-control PFET 280 gate electrode is above a high voltage level, this tends to turn off the body-charge control PFET 280 and electrically isolate the body of the PFET 270 from the source, thereby permitting a charge to accumulate on the body. When the voltage applied to the body-charge control PFET 280 gate electrode is below a low voltage level this tends to turn on the body-charge control PFET 280 and electrically couple the body to the source, thereby discharging at least a portion of any charge accumulated on the body.

Figure 3:
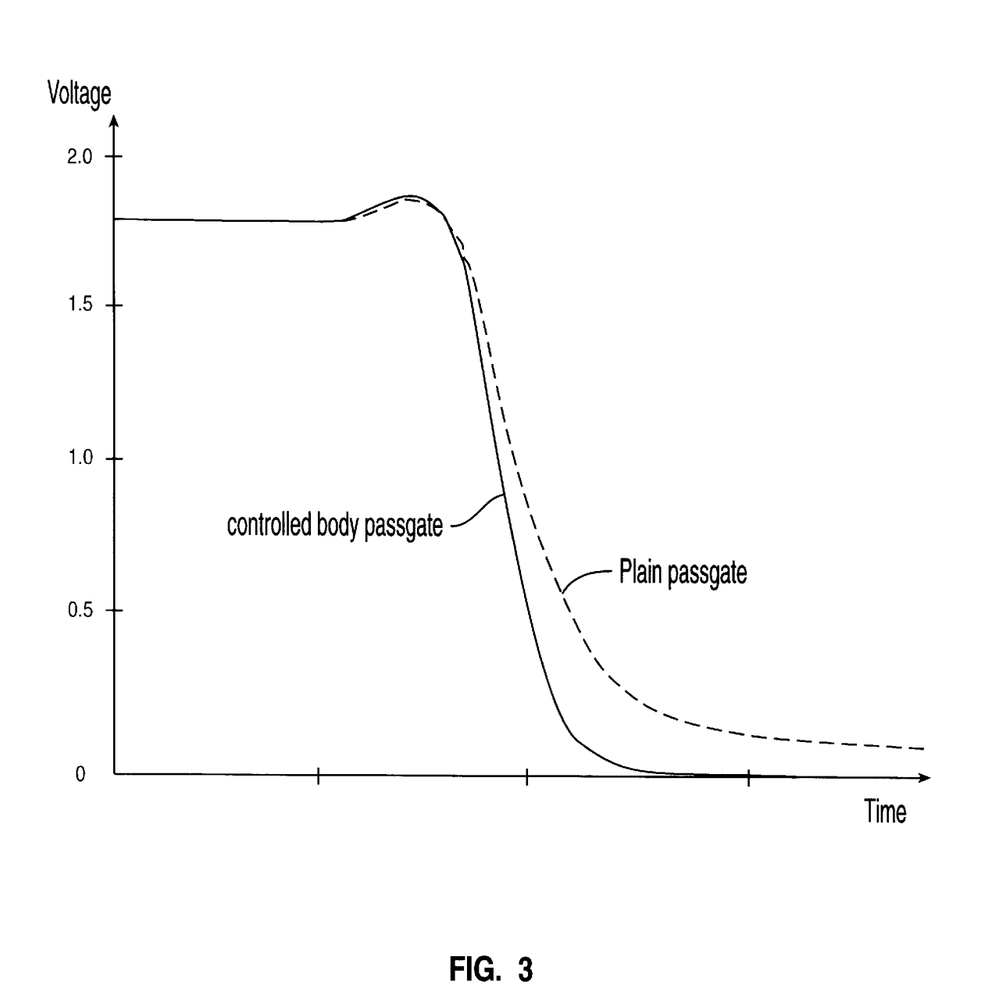
Figure 4:
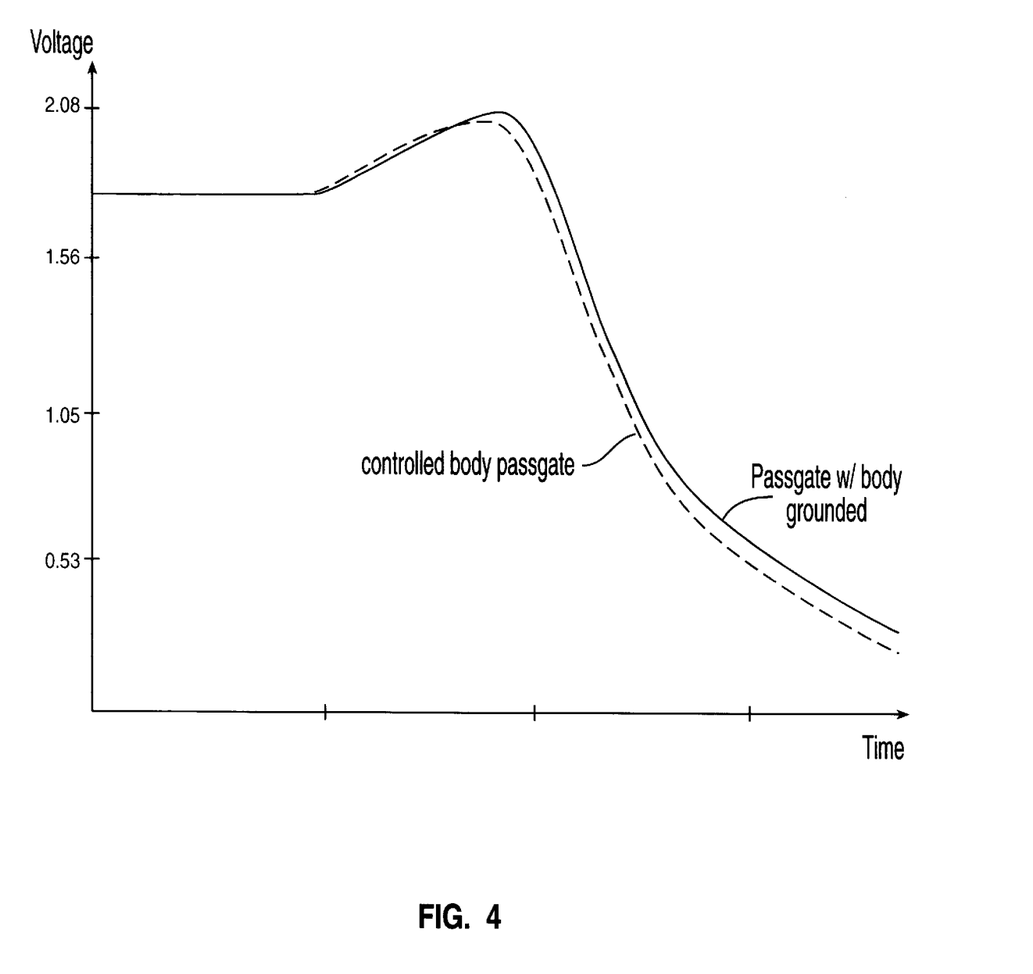
Figure 5:
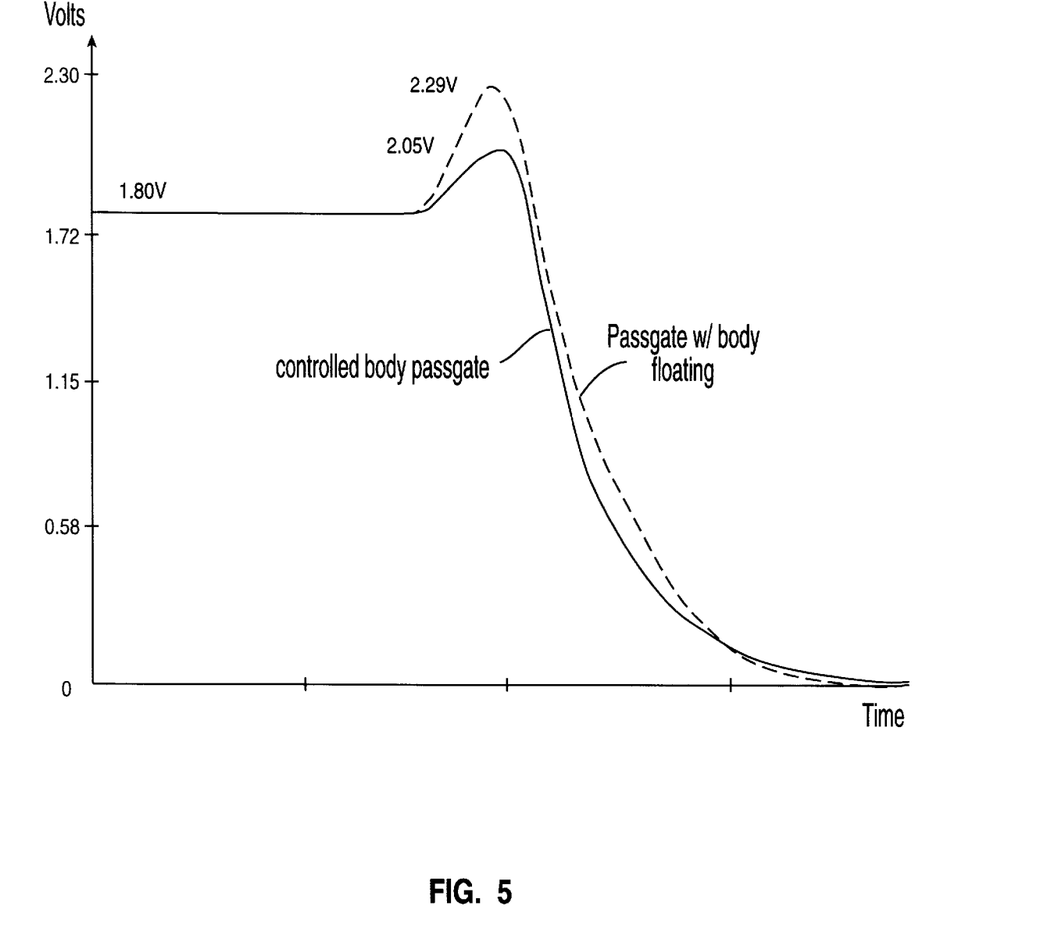

Results of simulations are shown in FIG's 3–5.

In FIG. 3, the voltage for the curve shown as "controlled body passgate" is measured from net1 to ground for the circuit of FIG. 2. For the curve labeled "plain passgate," the voltage shown is net1 to ground for a circuit such as FIG. 2, but wherein the inverter 260 and body-charge control FET 250 are omitted, and the body of FET 210 is floating. For both curves, the FET 210 is not selected, and the falling voltage at net1 is caused by switching internal to circuit block 220. Also in both cases, it is assumed that both net1 and net2 were high for some time before the switching, thereby aggravating the parasitic current of FET 210. The comparison indicates improved switching speed for the controlled body passgate. That is, the plain passgate switching is degraded by parasitic bipolar current In FIG. 4, the voltage for the curve shown as "controlled body passgate" is measured from net2 to ground for the circuit of FIG. 2. For the curve labeled "passgate with body grounded", the voltage shown is net2 to ground for a circuit such as FIG. 2, but wherein the inverter 260 and body-charge control FET 250 are omitted, and the body of FET 210 is directly grounded. For both curves, the falling voltage at net2 is caused by switching FET 210. A high-to low transition propagates from net1 to net2. Also in both cases, it is assumed that both net1 and net2 were high for some time before the switching, thereby aggravating the parasitic current of FET 210. The comparison indicates the controlled body passgate provides somewhat faster switching with no degradation in overshoot.

In FIG. 5, the voltage for the curve shown as "controlled body passgate" is measured from net2 to ground for the circuit of FIG. 2. For the curve labeled "passgate with body floating," the voltage shown is net2 to ground for a circuit such as FIG. 2, but wherein the inverter 260 and body-charge control FET 250 are omitted and the body of FET 210 is floating. For both curves, the falling voltage at net2 is caused by switching FET 210. Also in both cases, it is assumed that both net1 and net2 were high for some time before the switching, thereby aggravating the parasitic current of FET 210. The comparison indicates comparable switching speed, and an improvement in overshoot for the controlled body passgate.

Figure 6:
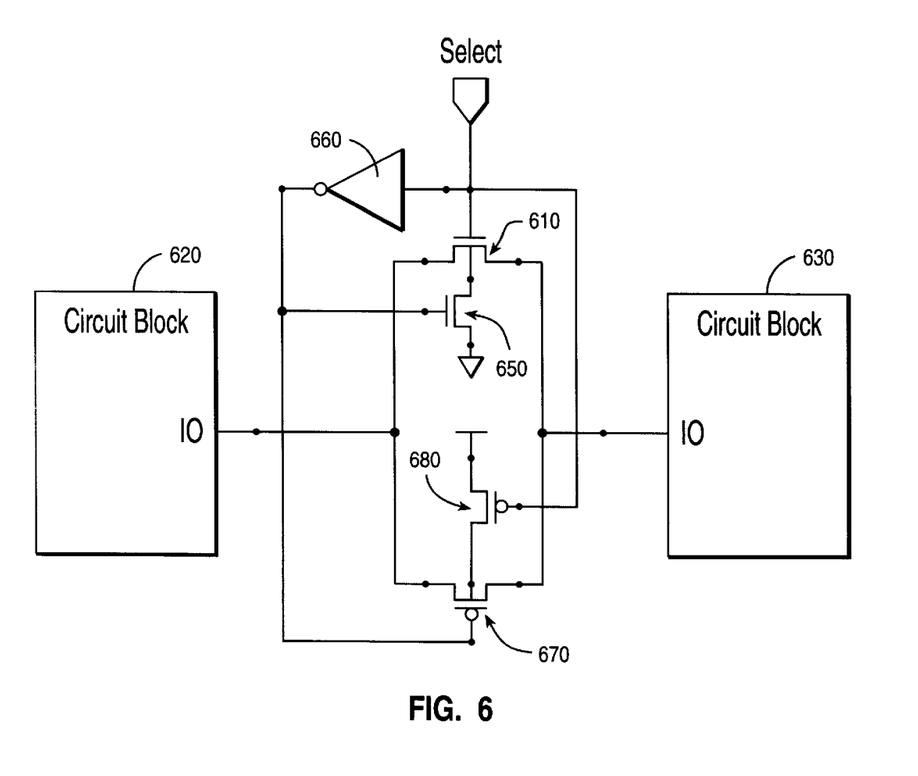
FIG. 6 is a schematic for a dual gate embodiment of the present invention.

FIG. 6 shows a PFET/NFET pair of passgates 610 and 670, with body-charge control circuitry, similar to the single passgate/body control circuitry of FIG. 2. In conventional applications of a PFET/NFET passgate pair, an inverter is provided for select control of the gate of the PFET. This inverter (inverter 660 in FIG. 6) conventionally provided for the PFET gate select control can be used for body-charge control circuitry as well, so that in comparison with conventional dual passgate/passgate control circuitry, the body-charge control circuitry requires only adding a body-charge control FET 650 and 680 for each of the respective passgate FET's 610 and 670.

Figure 7:
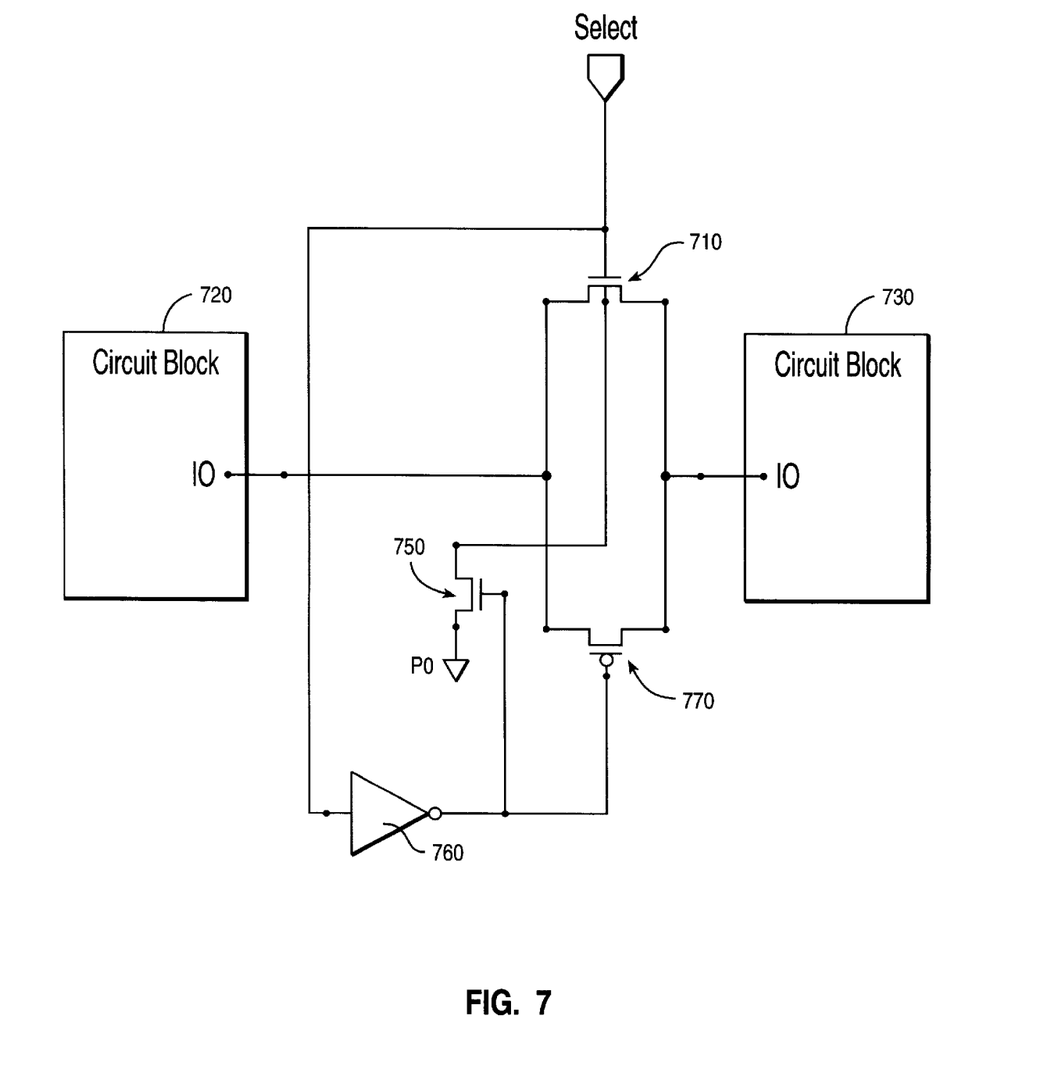
FIG. 7 is a schematic for a different dual gate embodiment of the present invention.

FIG. 7 shows a PFET/NFET pair of passgates 710 and 770, with body-charge control circuitry, similar to the dual passgate/body control circuitry of FIG. 6. The FIG. 7 embodiment is for an instance wherein the PFET passgate 770 is fabricated in a manner so as to reduce the PFET's susceptibility to parasitic bipolar current. In such an instance the body-charge control FET 680 of FIG. 6 may be omitted. Just as previously stated note that in conventional applications of a PFET/NFET passgate pair, an inverter is provided for select control of the gate of the PFET. This inverter (inverter 760 in FIG. 7) conventionally provided for the PFET gate select control can be used for body-charge control circuitry as well, so that in comparison with conventional dual passgate/passgate control circuitry, the body-charge control circuitry of FIG. 7 requires only adding a body-charge control FET 750 for the passgate FET 710.

What is claimed is:

1. An apparatus for reducing parasitic bipolar current in a field effect transistor ("FET"), comprising:
   a first FET, having a body disposed, at least in part, on an insulator; and
   control circuitry coupled to the body and a gate electrode of the first FET, for controlling charge on the body responsive solely to a single control circuitry input voltage, the voltage also being applied directly to the gate electrode, wherein the first FET is operable to turn on and off responsive to the voltage applied to the gate electrode, and wherein the control circuitry has a discharge path and the control circuitry is operable to turn on the path and discharge at least a portion of any charge on the body when the first FET is turned off, and to turn off the path and allow the body to float and charge to accumulate on the body when the first FET is turned on.

2. The apparatus of claim 1, wherein the discharge path comprises a body-charge control FET, having first and second conducting electrodes and a gate electrode, wherein the body-charge control FET first conducting electrode is electrically coupled to the body of the first FET and the body-charge control FET second conducting electrode is electrically coupled to an electrical sink, and wherein the control circuitry comprises an inverter having an inverter input electrically coupled to the first FET gate electrode, and an inverter output electrically coupled to the body-charge control FET gate electrode, so that the voltage applied to the first FET gate electrode being above a certain first voltage level tends to drive the inverter output voltage low, turn off the body-charge control FET and electrically isolate the body from the sink, thereby permitting the body to float and a charge to accumulate on the body, and the voltage applied to the first FET gate electrode being below a certain second voltage level tends to drive the inverter output voltage high, turn on the body-charge control FET and electrically couple the body to the sink, thereby discharging at least a portion of any charge accumulated on the body.

3. The apparatus of claim 2, wherein the first FET first and second conducting electrodes couple first circuitry to second circuitry, respectively, and the control circuitry is operable independently of the first and second circuitry since the control circuitry controls charge on the body of the first FET solely responsive to the voltage applied to the gate electrode of the first FET.

4. The apparatus of claim 3, wherein the first FET is a logic device in one leg of a logic circuit.

5. The apparatus of claim 3, wherein the first FET is a logic device in one branch of a multiplexer circuit.

6. The apparatus of claim 2, wherein the first FET is an NFET, the apparatus comprising:
   a second FET having a body disposed, at least in part, on an insulator, wherein the second FET is a PFET; and
   second control circuitry coupled to the body of the second FET and the gate of the first FET, for controlling charge on the second FET body responsive to a voltage applied to the gate electrode of the second insulated body FET.

7. The apparatus of claim 6, wherein the second control circuitry comprises a second body-charge control FET, the second body-charge control FET being a PFET having first and second conducting electrodes and a gate electrode, wherein the second body-charge control FET first conducting electrode is electrically coupled to the body of the second FET, the second body-charge control FET second conducting electrode is electrically coupled to an electrical source, and the second body-charge control FET gate electrode is coupled to the gate electrode of the first FET, so that the voltage applied to the second FET gate electrode being above a certain first voltage level tends to turn on the second body-charge control FET and electrically couple the second FET to the electrical source, thereby tending to discharge the body, and the voltage applied to the second FET gate electrode being below a certain second voltage tends to turn off the second body-charge control FET and electrically isolate the second FET body from the source, thereby permitting the body to float and a charge to accumulate on the body.

8. A method for reducing parasitic bipolar current in an n-type, field effect transistor ("NFET") having a body disposed, at least in part, on an insulator, comprising the steps of:
   a) turning off a control circuitry discharge path for the NFET responsive solely to a single voltage applied directly to a gate electrode of the NFET, wherein turning on the NFET by the single voltage turns off the discharge path and permits the body to float and a charge to accumulate on the body; and
   b) turning on the discharge path responsive solely to the single voltage applied directly to the NFET gate electrode, wherein turning off the NFET by the single voltage turns on the discharge path and discharges at least a portion of any charge on the body of the NFET.

9. The method of claim 8, wherein step b) comprises electrically coupling the NFET body to a sink, the sink having a voltage lower than a voltage level of the accumulated charge, wherein the NFET body is thus coupled to the sink whenever the NFET gate electrode voltage is turned off.

10. A method for reducing parasitic bipolar current in an p-type, field effect transistor ("PFET") having a body disposed, at least in part, on an insulator, comprising the steps of:
   a) turning on a control circuitry discharge path responsive solely to a single voltage applied directly to a gate electrode of the PFET, wherein turning off the PFET by the single voltage turns on the discharge path and discharges at least a portion of any charge on the body of the PFET; and
   b) turning off the discharge path responsive solely to the single voltage applied directly to the gate electrode of the PFET, wherein turning on the PFET by the single voltage applied directly to the gate electrode of the PFET turns off the discharge path and permits the body to float and charge to accumulate on the body.

11. The method of claim 10, wherein step a) comprises electrically coupling the PFET body to a voltage source whenever the PFET gate electrode voltage is above a certain first voltage level.

12. An apparatus for reducing parasitic bipolar current in a field effect transistor ("FET"), comprising:
   a first p-type FET ("PFET") having a body disposed, at least in part, on an insulator; and
   control circuitry coupled to the body and the gate of the first PFET, wherein the control circuitry comprises:
      a body-charge control PFET, having first and second conducting electrodes and a gate electrode, wherein the body-charge control PFET first conducting electrode is electrically coupled to the body of the first PFET, and the body-charge control PFET second conducting electrode is electrically coupled to an electrical source; and
      an inverter having an inverter input electrically coupled to the body-charge control PFET gate electrode, and an inverter output electrically coupled to the first PFET gate electrode, wherein the control circuitry controls charge on the first PFET solely responsive to a voltage applied directly to the body-charge control PFET gate, wherein the voltage applied to the body-charge control PFET gate electrode being above a certain first voltage level tends to turn off the body-charge control PFET and electrically isolate the body from the source, thereby permitting the body to float and a charge to accumulate on the body, and the voltage applied to the body-charge control PFET gate electrode being below a certain second voltage level tends to turn on the body-charge control PFET and electrically couple the body to the source, thereby discharging at least a portion of any charge accumulated on the body.

13. Control circuitry for reducing parasitic bipolar current in a first n-type field effect transistor ("NFET"), the first NFET having a body disposed, at least in part, on an insulator, the control circuitry consisting of:
   a body-charge control NFET having first and second conducting electrodes and a gate electrode, wherein the body-charge control NFET first conducting electrode is electrically coupled to the body of the first NFET, and the body-charge control NFET second conducting electrode is electrically coupled to an electrical sink; and
   an inverter having an inverter input electrically coupled to the first NFET gate electrode, and an inverter output electrically coupled to the body-charge control NFET gate electrode, so that a voltage applied to a gate electrode of the first NFET being above a certain first voltage level tends to turn on the first NFET and drive the inverter output voltage low, tending to turn off the body-charge control NFET, and the voltage applied to the first NFET gate electrode being below a certain second voltage level tends to turn off the first NFET, and drive the inverter output voltage high, tending to turn on the body-charge control NFET.

14. Control circuitry for reducing parasitic bipolar current in a first p-type, field effect transistor ("PFET"), the first PFET having a body disposed, at least in part, on an insulator, the control circuitry consisting of:
   a body-charge control PFET having first and second conducting electrodes and a gate electrode, wherein the body-charge control PFET first conducting electrode is electrically coupled to the body of the first PFET, and the body-charge control PFET second conducting electrode is electrically coupled to an electrical source; and
   an inverter having an inverter input electrically coupled to the body-charge control PFET gate electrode, and an inverter output electrically coupled to a gate electrode of the first PFET, so that a voltage applied to the body-charge control PFET gate electrode being above a certain first voltage level tends to turn off the body-charge control PFET and drive the inverter output voltage low, tending to turn on the first PFET, and the voltage applied to the body-charge control PFET gate electrode being below a certain second voltage level tends to turn on the body-charge control PFET and drive the inverter output voltage high, tending to turn off the first PFET.

15. Control circuitry for a complementary passgate device, the device having a first p-type, field effect transistor "(PFET")", the first PFET having a body disposed, at least in part, on an insulator, and a first n-type field effect transistor "(NFET")", the first NFET having a body disposed, at least in part, on an insulator, the control circuitry consisting of:

an inverter; and a body-charge control NFET, having first and second conducting electrodes and a gate electrode, wherein the body-charge control NFET first conducting electrode is electrically coupled to the body of the first NFET, and the body-charge control NFET second conducting electrode is electrically coupled to an electrical sink, wherein an input of the inverter is electrically coupled to a gate electrode of the first NFET, and an output of the inverter is electrically coupled to the body-charge control NFET gate electrode and a gate electrode of the first PFET, so that a voltage applied to the first NFET gate electrode being above a certain first voltage level tends to turn on the first NFET, and drive the inverter output voltage low, tending to turn on the first PFET and turn off the body-charge control NFET, permitting the body of the first NFET to float and charge to accumulate on the body of the first NFET, and the voltage applied to the first NFET gate electrode being below a certain second voltage level tends to turn off the first NFET, and drive the inverter output voltage high, tending to turn off the first PFET and turn on the body-charge control NFET, discharging any charge accumulated on the body of the first NFET.

16. Control circuitry for a complementary passgate device, the device having a first p-type, field effect transistor "(PFET")", the first PFET having a body disposed, at least in part, on an insulator, and a first n-type field effect transistor "(NFET")", the first NFET having a body disposed, at least in part, on an insulator, the control circuitry consisting of:

an inverter;

a body-charge control NFET, having first and second conducting electrodes and a gate electrode, wherein the body-charge control NFET first conducting electrode is electrically coupled to the body of the first NFET, and the body-charge control NFET second conducting electrode is electrically coupled to an electrical sink, a body-charge control PFET, having first and second conducting electrodes and a gate electrode, wherein the body-charge control PFET first conducting electrode is electrically coupled to the body of the first PFET, the body-charge control PFET second conducting electrode is electrically coupled to an electrical source, wherein an input of the inverter is coupled to a gate electrode of the first NFET and the body-charge control PFET gate electrode, and an output of the inverter is electrically coupled to the body-charge control NFET gate electrode and a gate electrode of the first PFET, so that a voltage applied to the first NFET gate electrode being above a certain first voltage level tends to i) turn on the first NFET and turn off the body-charge control PFET, permitting the body of the first PFET to float and charge to accumulate on the body of the first PFET, and ii) drive the inverter output voltage low, tending to turn on the first PFET and turn off the body-charge control NFET, permitting the body of the first NFET to float and charge to accumulate on the body of the first NFET, and the voltage applied to the first NFET gate electrode being below a certain second voltage level tends to i) turn off the first NFET and turn on the body-charge control PFET, discharging any charge accumulated on the body of the first PFET, and ii) drive the inverter output voltage high, tending to turn off the first PFET and turn on the body-charge control NFET, discharging any charge accumulated on the body of the first NFET.

17. A method for controlling a first n-type field effect transistor ("NFET"), the first NFET having a body disposed, at least in part, on an insulator, the method consisting of the steps of:

applying a first voltage level to a gate electrode of the first NFET, wherein the first voltage level tends to turn on the first NFET and drive an output voltage low for an inverter having an inverter input electrically coupled to the first NFET gate electrode and an inverter output electrically coupled to a gate electrode of a body-charge control NFET, wherein the body-charge control NFET has a first conducting electrode electrically coupled to the body of the first NFET, and a second conducting electrode electrically coupled to an electrical sink, so that the inverter output being low tends to turn off the body-charge control NFET; and applying a second voltage level to the first NFET gate electrode, wherein the second voltage level tends to turn off the first NFET, and drive the inverter output voltage high, tending to turn on the body-charge control NFET.

18. A method for controlling a first p-type, field effect transistor ("PFET"), the first PFET having a body disposed, at least in part, on an insulator, the method consisting of the steps of:

applying a first voltage level to a gate electrode of a body-charge control PFET, wherein an inverter has an inverter input electrically coupled to the body-charge control PFET gate electrode, and an inverter output electrically coupled to a gate electrode of the first PFET, wherein the body-charge control PFET has a first conducting electrode electrically coupled to the body of the first PFET, and a second conducting electrode electrically coupled to an electrical source, and wherein the first voltage level tends to turn off the body-charge control PFET and drive the inverter output voltage low, tending to turn on the first PFET; and applying a second voltage level to the body-charge control PFET gate electrode, wherein the second voltage level tends to turn on the body-charge control PFET and drive the inverter output voltage high, tending to turn off the first PFET.

19. A method for controlling a complementary passgate device, the device having a first p-type, field effect transistor "(PFET")", the first PFET having a body disposed, at least in part, on an insulator, and a first n-type field effect transistor "(NFET")", the first NFET having a body disposed, at least in part, on an insulator, the method consisting of the steps of:

applying a first voltage level to the first NFET gate electrode, wherein a body-charge control NFET has a first conducting electrode electrically coupled to the body of the first NFET, and a second conducting electrode electrically coupled to an electrical sink, and an input of an inverter is electrically coupled to a gate electrode of the first NFET, and an output of the inverter is electrically coupled to the body-charge control NFET gate electrode and a gate electrode of the first PFET, wherein the first voltage level tends to turn on the first NFET, and drive an inverter output voltage low, tending to turn on the first PFET and turn off the body-charge control NFET, permitting the body of the first NFET to float and charge to accumulate on the body of the first NFET;

applying a second voltage level to the first NFET gate electrode, wherein the second voltage level tends to turn off the first NFET, and drive the inverter output voltage high, tending to turn off the first PFET and turn on the body-charge control NFET, discharging any charge accumulated on the body of the first NFET.

20. A method for turning on and off a complementary passgate device, the device having a first p-type, field effect transistor "(PFET)", the first PFET having a body disposed, at least in part, on an insulator, and a first n-type field effect transistor "(NFET)", the first NFET having a body disposed, at least in part, on an insulator, the method consisting of the steps of:

applying a first voltage level to the first NFET gate electrode, wherein a body-charge control NFET has a first conducting electrode electrically coupled to the body of the first NFET, and a second conducting electrode electrically coupled to an electrical sink, wherein a body-charge control PFET has a first conducting electrode electrically coupled to the body of the first PFET, and a second conducting electrode electrically coupled to an electrical source, wherein an input of an inverter is electrically coupled to a gate electrode of the first NFET and the body-charge control PFET gate electrode, and an output of the inverter is electrically coupled to the body-charge control NFET gate electrode and the first PFET gate electrode, and wherein the first voltage level tends to i) turn on the first NFET and turn off the body-charge control PFET, permitting the body of the first PFET to float and charge to accumulate on the body of the first PFET, and ii) drive the inverter output voltage low, tending to turn on the first PFET and turn off the body-charge control NFET, permitting the body of the first NFET to float and charge to accumulate on the body of the first NFET; and applying a second voltage level to a gate electrode of the first NFET gate electrode, wherein the second voltage level tends to i) turn off the first NFET and turn on the body-charge control PFET, discharging any charge accumulated on the body of the first PFET, and ii) drive the inverter output voltage high, tending to turn off the first PFET and turn on the body-charge control NFET, discharging any charge accumulated on the body of the first NFET.

* * * * *